US012366902B2

(12) United States Patent
Mao

(10) Patent No.: US 12,366,902 B2
(45) Date of Patent: Jul. 22, 2025

(54) ELECTRONIC DEVICE WITH PLUGGING AND UNPLUGGING FUNCTION

(71) Applicant: Wistron Corp., New Taipei (TW)

(72) Inventor: Zhong-Hui Mao, New Taipei (TW)

(73) Assignee: Wistron Corp., New Taipei (TW)

( * ) Notice: Subject to any disclaimer, the term of this patent is extended or adjusted under 35 U.S.C. 154(b) by 186 days.

(21) Appl. No.: 18/302,736

(22) Filed: Apr. 18, 2023

(65) Prior Publication Data

US 2024/0201754 A1    Jun. 20, 2024

(30) Foreign Application Priority Data

Dec. 19, 2022    (CN) .......................... 202211631105.8

(51) Int. Cl.
*G06F 1/18* (2006.01)
*H01R 43/26* (2006.01)
*H05K 7/14* (2006.01)

(52) U.S. Cl.
CPC ............. *G06F 1/183* (2013.01); *H01R 43/26* (2013.01); *H05K 7/1427* (2013.01); *H05K 7/1485* (2013.01); *H01R 2201/06* (2013.01)

(58) Field of Classification Search
None
See application file for complete search history.

(56) References Cited

U.S. PATENT DOCUMENTS

| | | | | |
|---|---|---|---|---|
| 5,619,398 A * | 4/1997 | Harrison | ............... | G06F 1/1632 |
| 10,251,300 B1 * | 4/2019 | Mao | .................... | H05K 7/1487 |
| 10,470,334 B1 * | 11/2019 | Mao | .................... | H05K 7/1489 |
| 10,840,643 B1 * | 11/2020 | Jin | ....................... | H01R 12/722 |
| 10,863,644 B1 * | 12/2020 | Tseng | ................... | H05K 7/1487 |
| 2003/0012512 A1 * | 1/2003 | Grimes | ............... | H05K 7/1409 |
| | | | | 385/53 |
| 2015/0103492 A1 * | 4/2015 | Wu | ...................... | H05K 7/1431 |
| | | | | 361/726 |
| 2023/0129374 A1 * | 4/2023 | Albright | ........... | H05K 7/20172 |
| | | | | 439/527 |

* cited by examiner

*Primary Examiner* — Allen L Parker
*Assistant Examiner* — Christopher L Augustin

(57) ABSTRACT

An electronic device with plugging and unplugging function is provided. The electronic device has a connector. The connector is adapted to be connected to a connection port of an electronic module. The electronic device includes a tray unit, a housing and a moving mechanism. The tray unit is moveably disposed in the housing. The moving mechanism is disposed on the housing, wherein the tray unit moves the moving mechanism, and the moving mechanism moves the connector to be connected to or disconnected from the connection port.

20 Claims, 12 Drawing Sheets

ELECTRONIC DEVICE WITH PLUGGING AND UNPLUGGING FUNCTION

CROSS REFERENCE TO RELATED APPLICATIONS

This Application claims priority of China Patent Application No. 202211631105.8, filed on Dec. 19, 2022, the entirety of which is incorporated by reference herein.

BACKGROUND OF THE INVENTION

Field of the Invention

The present invention relates to an electronic device, and, in particular, to an electronic device with plugging and unplugging function.

Description of the Related Art

As the increased computing power of the graphics processing unit (GPU), the size and weight of the graphics processing unit (GPU) module begin to increase. In the conventional graphics processing unit (GPU) server, the weight of the graphics processing unit (GPU) module can reach 10 kilograms. Due to the increased size and weight of the graphics processing unit (GPU) module, it is difficult for assemblers to plug the connection port of the electronic module (such as a graphics processing unit module) to the connector of the server, or to unplug the connection port of the electronic module from the connector of the server, in the restricted server space.

BRIEF SUMMARY OF THE INVENTION

An embodiment of the present invention provides an electronic device with plugging and unplugging function. The electronic device has a connector. The connector is selectively connected to a connection port of an electronic module. The electronic device includes a tray unit, a housing and a moving mechanism. The tray unit is moveably disposed in the housing. The moving mechanism is disposed on the housing, wherein the moving mechanism is moved by the tray unit, and the connector is connected to or disconnected from the connection port via being moved by the moving mechanism.

In one embodiment, the tray unit comprises a tray body, a first handle, a second handle and a switching block. The first handle is connected to the tray body. The second handle is connected to the tray body. The switching block is disposed at the second handle and is moveably connected to the tray body. The tray unit is adapted to be moved relatively to the housing in a first direction.

In one embodiment, the moving mechanism comprises a first gear unit, a second gear unit, a first block, a second block and a connecting rod. The first gear unit is connected to the first block. The second gear is connected to the second block. The connecting rod is adapted to be connected to the first block and a second block. The second block is adapted to be moved relatively to the first block in a second direction. The second direction is perpendicular to the first direction.

In one embodiment, the first handle comprises a first gear section, a second gear section and an empty section, the empty section is located between the first gear section and the second gear section, the first gear unit is adapted to be connected to the first gear section or the second gear section.

In one embodiment, the first block comprises a first gear portion, the first gear unit is adapted to be connected to the first gear portion, and an extending direction of the first gear portion is perpendicular to an extending direction of the first gear section and the second gear section.

In one embodiment, the first gear unit comprises a first big gear and a first small gear, the first big gear is coaxial with the first small gear, the first big gear is adapted to be connected to the first gear section or the second gear section, and the first small gear is adapted to be connected to the first gear portion.

In one embodiment, the switching block comprises a switching block gear portion, the second block comprises a second gear portion, the second gear unit is adapted to be connected to the second gear portion, and an extending direction of the second gear portion is perpendicular to an extending direction of the switching block gear portion.

In one embodiment, the second gear unit comprises a second big gear and a second small gear, the second big gear is coaxial with the second small gear, the second big gear is adapted to be selectively connected to the switching block gear portion, and the second small gear is adapted to be connected to the second gear portion.

In one embodiment, the housing comprises a housing post, the switching block comprises a switching groove, the housing post is adapted to slide in the switching groove and to move the switching block.

In one embodiment, the switching groove is U-shaped.

In one embodiment, the connecting rod comprises a rod hook, the second block comprises a block hook, the rod hook is selectively connected to the block hook, and the connecting rod pivots on the first block.

In one embodiment, the electronic device further comprises a first elastic member, the first elastic member is connected to the first block and the connecting rod, the first elastic member is adapted to apply a first elastic force to the connecting rod.

In one embodiment, the tray unit comprises a switching post, the switching post is adapted to move the connecting rod.

In one embodiment, the electronic device further comprises a second elastic member, wherein the second elastic member is connected to the housing and the second block, the second elastic member is adapted to apply a second elastic force to the housing and the second block.

In one embodiment, the electronic device further comprises a stage, the connector is disposed on the stage, and the stage is moveably connected to the second block.

In one embodiment, the electronic device further comprises a third elastic member, wherein the third elastic member is connected to the stage and the second block, the third elastic member is adapted to apply a third elastic force to the stage and the second block.

In one embodiment, the housing comprises a stopper, and the stopper is adapted to stop the stage.

In one embodiment, the tray unit comprises a locking post, the first block comprises a block restricting portion, and the locking post is adapted to be selectively connected to the block restricting portion.

In one embodiment, the first handle pivots on the tray body, and the second handle pivots on the tray body.

In one embodiment, the electronic module is a graphics processing module.

Utilizing the electronic device with plugging and unplugging function of the embodiment of the invention, the tray unit is adapted to move the moving mechanism to connect the connector to the connection port or to separate the connector from the connection port. The user thus can mount the electronic module or remove the electronic module easily. Particularly, when the electronic module has great size and weight, the connector can be connected to the connection port with the weight of the electronic module. When the user lifts up the tray unit, the connector is separated from the connection port automatically. Additionally, utilizing the coaxial gears, the user can reduce the time and effort required for assembly.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1A:
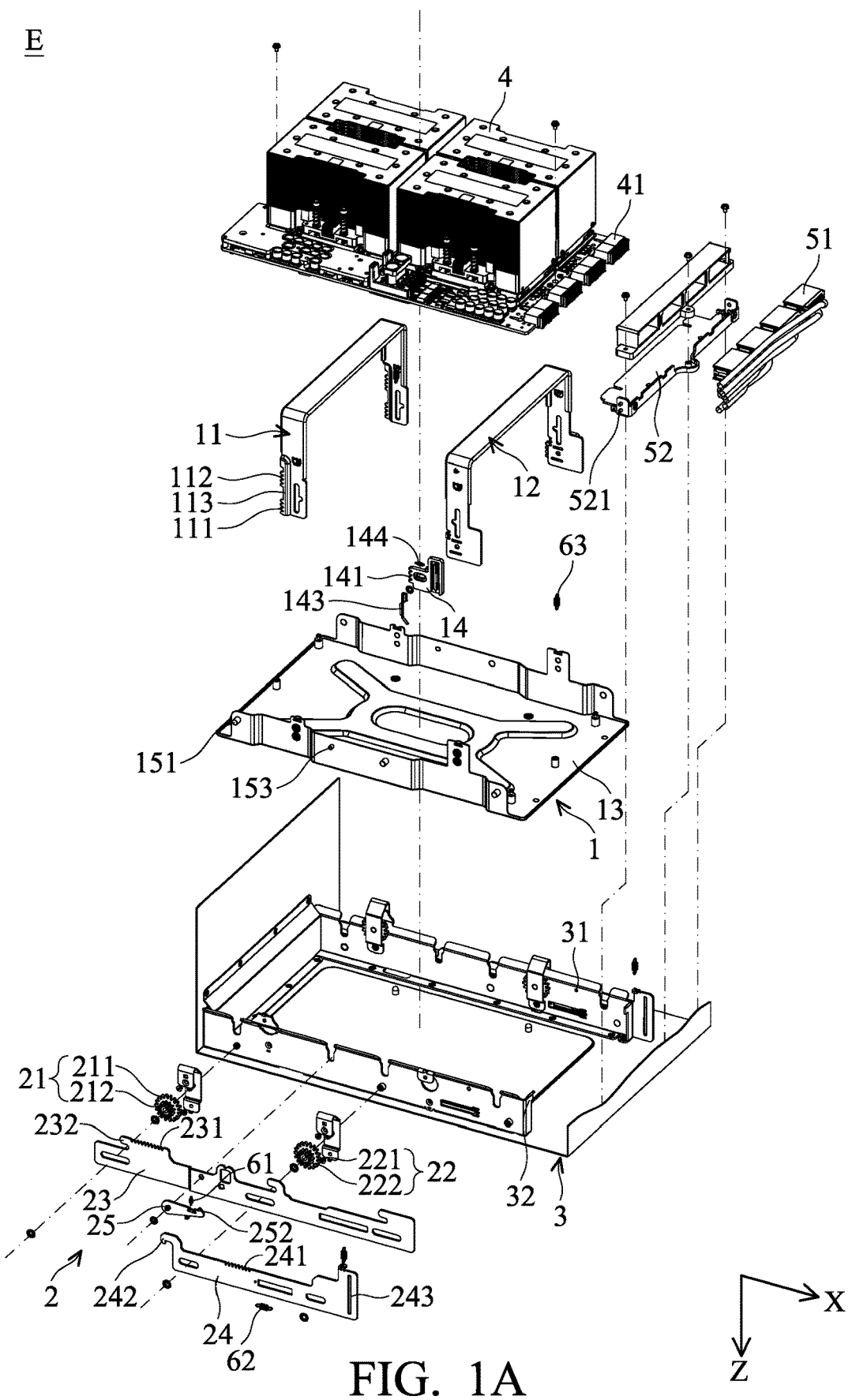
FIG. 1A is an exploded view of the electronic device of the embodiment of the invention.
Figure 1B:
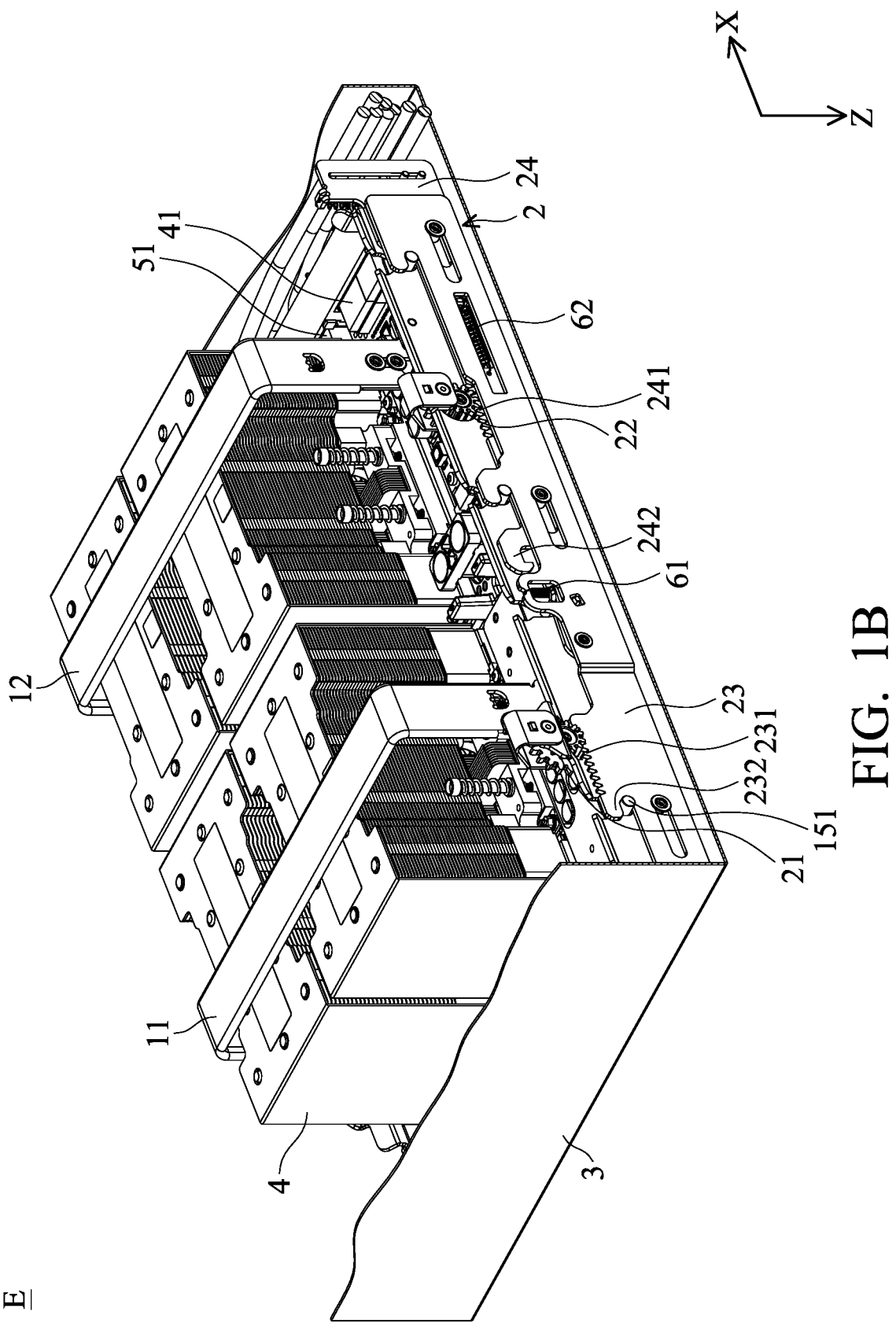
FIG. 1B is an assembled view of the electronic device of the embodiment of the invention.

FIG. 1A is an exploded view of the electronic device of the embodiment of the invention. FIG. 1B is an assembled view of the electronic device of the embodiment of the invention. With reference to FIGS. 1A and 1B, the electronic device E with plugging and unplugging function of the embodiment includes a tray unit 1, an electronic module 4, a housing 3, a moving mechanism 2 and a connector 51. The electronic module 4 is disposed on the tray unit 1. The electronic module 4 includes a connection port 41. The moving mechanism 2 is disposed on the housing 3. The tray unit 1 moves the moving mechanism 2. The moving mechanism 2 moves the connector 51 to be connected to or disconnected from the connection port 41.

In one embodiment, the electronic device E can be a GPU server, and the electronic module 4 can be a GPU module.

Figure 2:
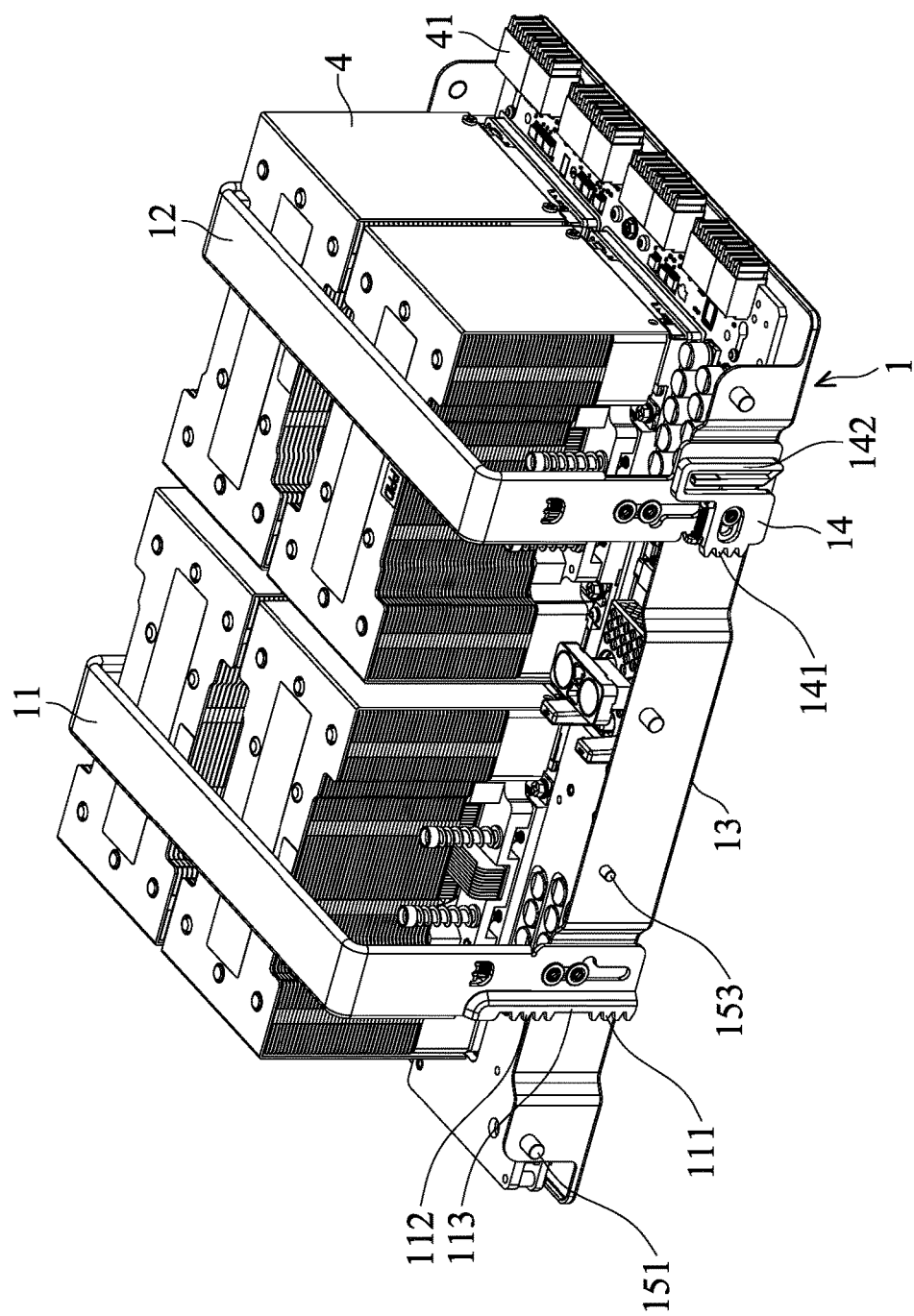
FIG. 2 shows the details of the tray unit and the electronic module of the embodiment of the invention.
Figure 3:
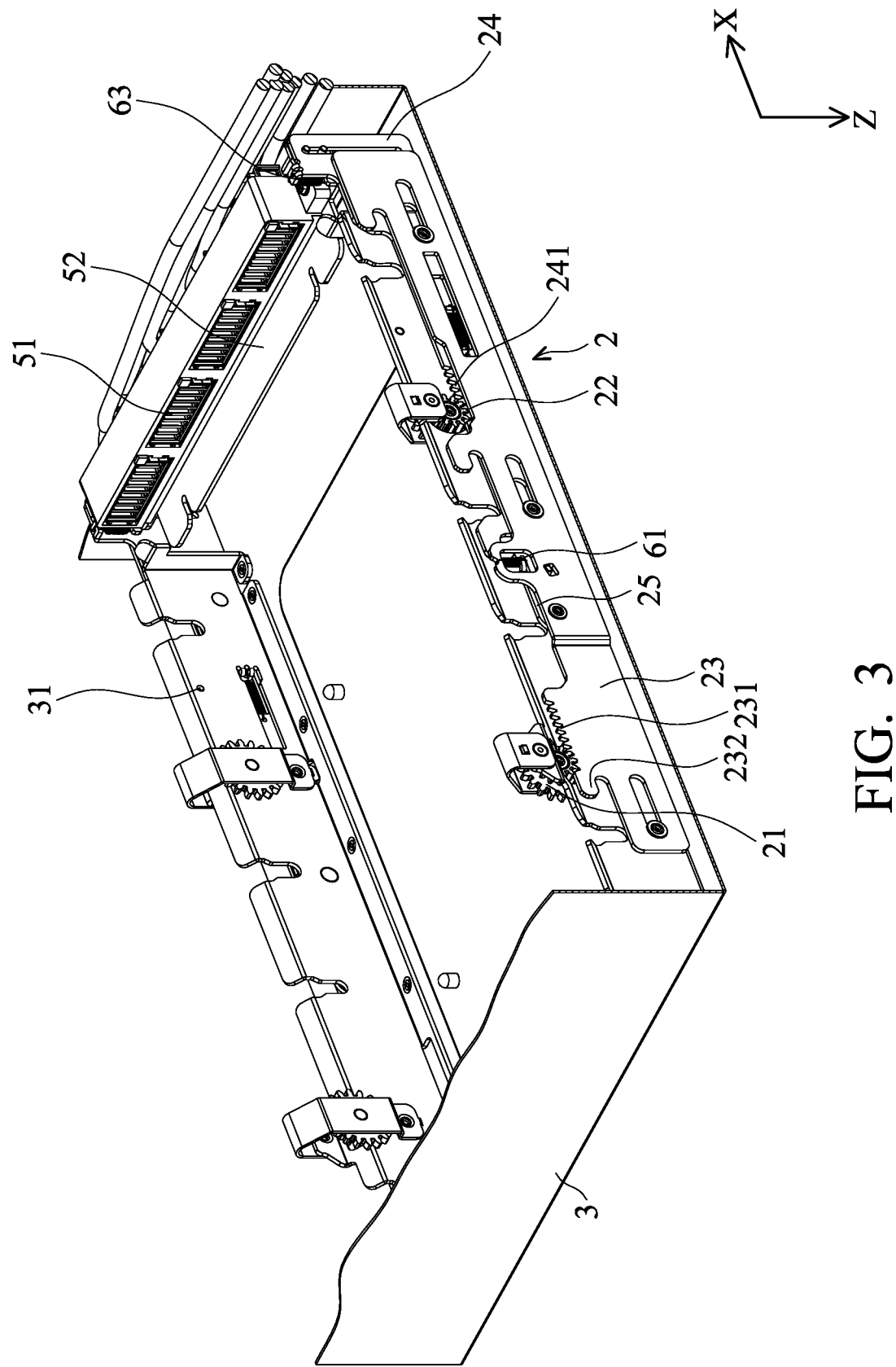
FIG. 3 shows the details of the housing, the moving mechanism and the connector of the embodiment of the invention.

FIG. 2 shows the details of the tray unit and the electronic module of the embodiment of the invention. FIG. 3 shows the details of the housing, the moving mechanism and the connector of the embodiment of the invention. With reference to FIGS. 1A, 1B, 2 and 3, in one embodiment, the tray unit 1 comprises a tray body 13, a first handle 11, a second handle 12 and a switching block 14. The first handle 11 is connected to the tray body 13. The second handle 12 is connected to the tray body 13. The switching block 14 is disposed at the second handle 12. The switching block 14 and the second handle 12 are moveably connected to the tray body 13. The tray unit 1 is adapted to be moved relatively to the housing 3 in a first direction Z.

With reference to FIGS. 1A, 1B, 2 and 3, in one embodiment, the moving mechanism 2 comprises a first gear unit 21, a second gear unit 22, a first block 23, a second block 24 and a connecting rod 25. The first gear unit 21 is connected to the first block 23. The second gear 22 is connected to the second block 24. The connecting rod 25 is adapted to be connected to the first block 23 and a second block 24. The first block 23 can be moved relatively to the second block 24. The second block 24 is adapted to be moved relatively to the first block 23 in a second direction X. The second direction X is perpendicular to the first direction Z.

With reference to FIGS. 1A and 2, in one embodiment, the first handle 11 comprises a first gear section 111, a second gear section 112 and an empty section 113. The empty section 113 is located between the first gear section 111 and the second gear section 112. The first gear unit 21 is adapted to be connected to the first gear section 111 or the second gear section 112.

With reference to FIGS. 1A and 3, in one embodiment, the first block 23 comprises a first gear portion 231. The first gear unit 21 is adapted to be connected to the first gear portion 231. An extending direction of the first gear portion 231 is perpendicular to an extending direction of the first gear section 111 and the second gear section 112. The extending direction of the first gear portion 231 is parallel to the second direction X. The extending direction of the first gear section 111 and the second gear section 112 is parallel to the first direction Z.

With reference to FIGS. 1A and 3, in one embodiment, the first gear unit 21 comprises a first big gear 211 and a first small gear 212. The first big gear 211 is coaxial with the first small gear 212. The first big gear 211 is adapted to be connected to the first gear section 111 or the second gear section 112. The first small gear 212 is adapted to be connected to the first gear portion 231, and provides labor-saving effect for user. In the embodiment of the invention, the radius of the first big gear 211 is greater than the radius of the first small gear 212.

With reference to FIGS. 1A, 2 and 3, in one embodiment, the switching block 14 comprises a switching block gear portion 141, a switching groove 142, a switching elastic sheet 143 and a switching spring 144. One end of the switching spring 144 is connected to the second handle 12, and the other end of the switching spring 144 is connected to the switching block 14. When the switching block 14 is moved, the switching spring 144 provides a recovery force. The second block 24 comprises a second gear portion 241. The second gear unit 22 is adapted to be connected to the second gear portion 241. An extending direction of the second gear portion 241 is perpendicular to an extending direction of the switching block gear portion 141. The extending direction of the second gear portion 241 is parallel to the second direction X. The extending direction of the switching block gear portion 141 is parallel to the first direction Z.

With reference to FIGS. 1A, 2 and 3, in one embodiment, the second gear unit 22 comprises a second big gear 221 and a second small gear 222. The second big gear 221 is coaxial with the second small gear 222. The second big gear 221 is adapted to be selectively connected to the switching block gear portion 141. The second small gear 222 is adapted to be connected to the second gear portion 241, and provides labor-saving effect for user. In the embodiment of the invention, the radius of the second big gear 221 is greater than the radius of the second small gear 222.

With reference to FIGS. 2 and 3 (and FIG. 4C mentioned below), in one embodiment, the housing 3 comprises a housing post 31. The housing post 31 is adapted to slide in the switching groove 142 and to move the switching block 14. In one embodiment, the switching groove 142 is U-shaped. The switching elastic sheet 143 is disposed in the left-side switching groove 142, and the housing post 31 thus is moved in the switching groove 142 only in a clockwise direction.

With reference to FIG. 1A, in one embodiment, the connecting rod 25 comprises a rod hook 252. The second block 24 comprises a block hook 242. The rod hook 252 is selectively connected to the block hook 242. The connecting rod 25 pivots on the first block 23.

With reference to FIGS. 1A and 3, in one embodiment, the electronic device further comprises a first elastic member 61. The first elastic member 61 is connected to the first block 23 and the connecting rod 25. The first elastic member 61 is adapted to apply a first elastic force to the connecting rod 25 to return the connecting rod 25 to the original position.

Figure 4A:
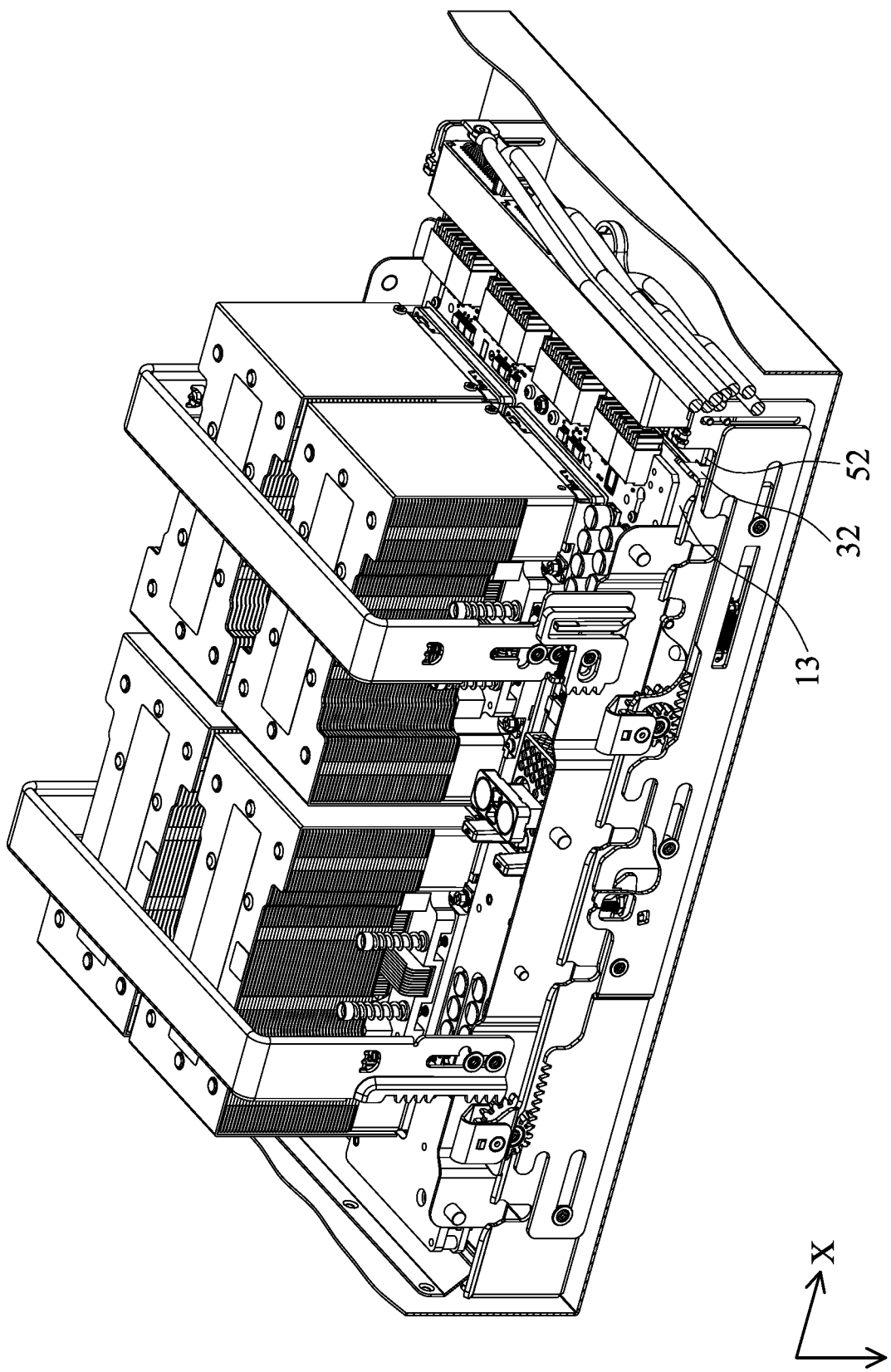
FIGS. 4A~4E shows the assembling process of the electronic device of the embodiment of the invention.
Figure 4B:
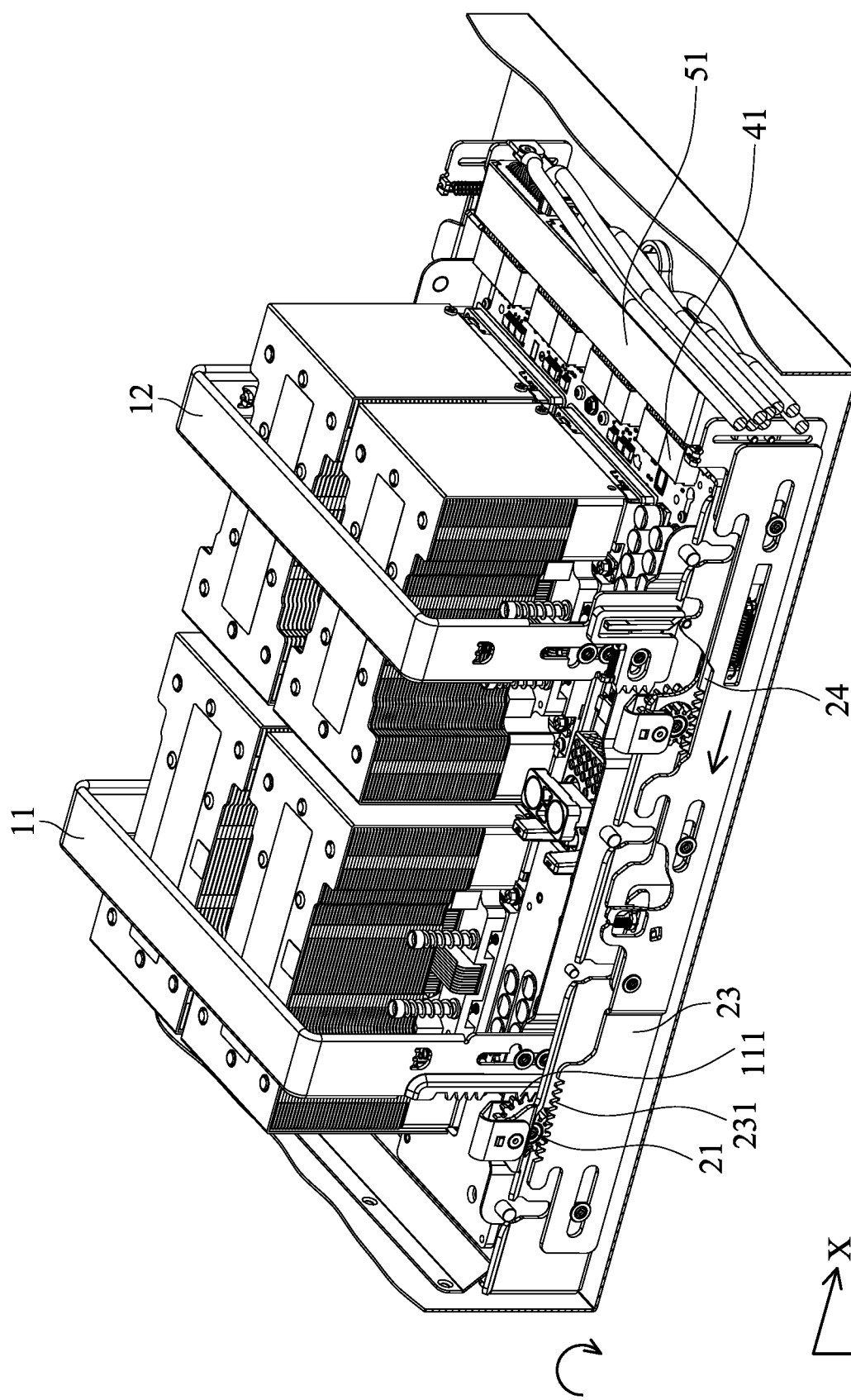
Figure 4C:
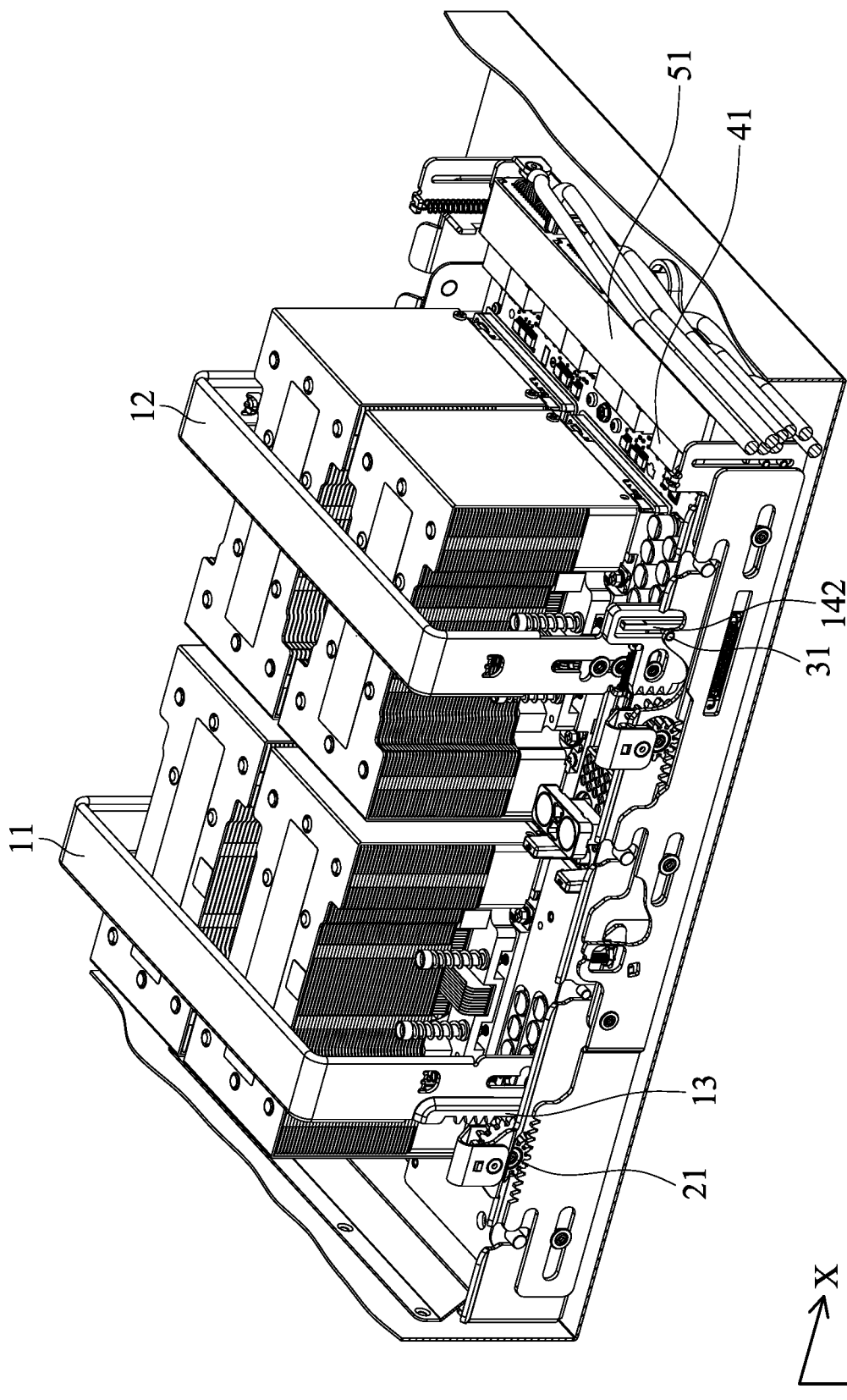
Figure 4D:
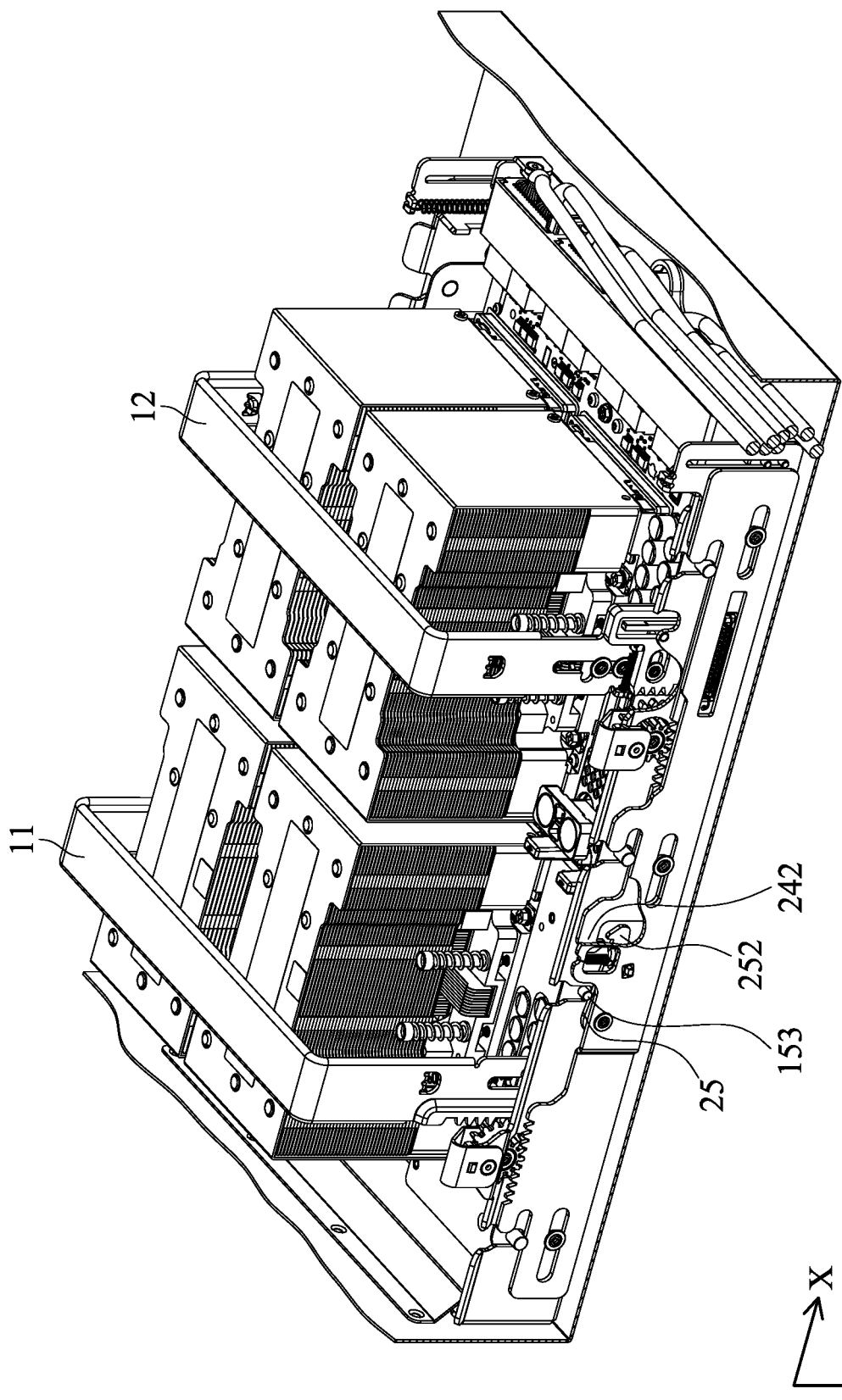
Figure 4E:
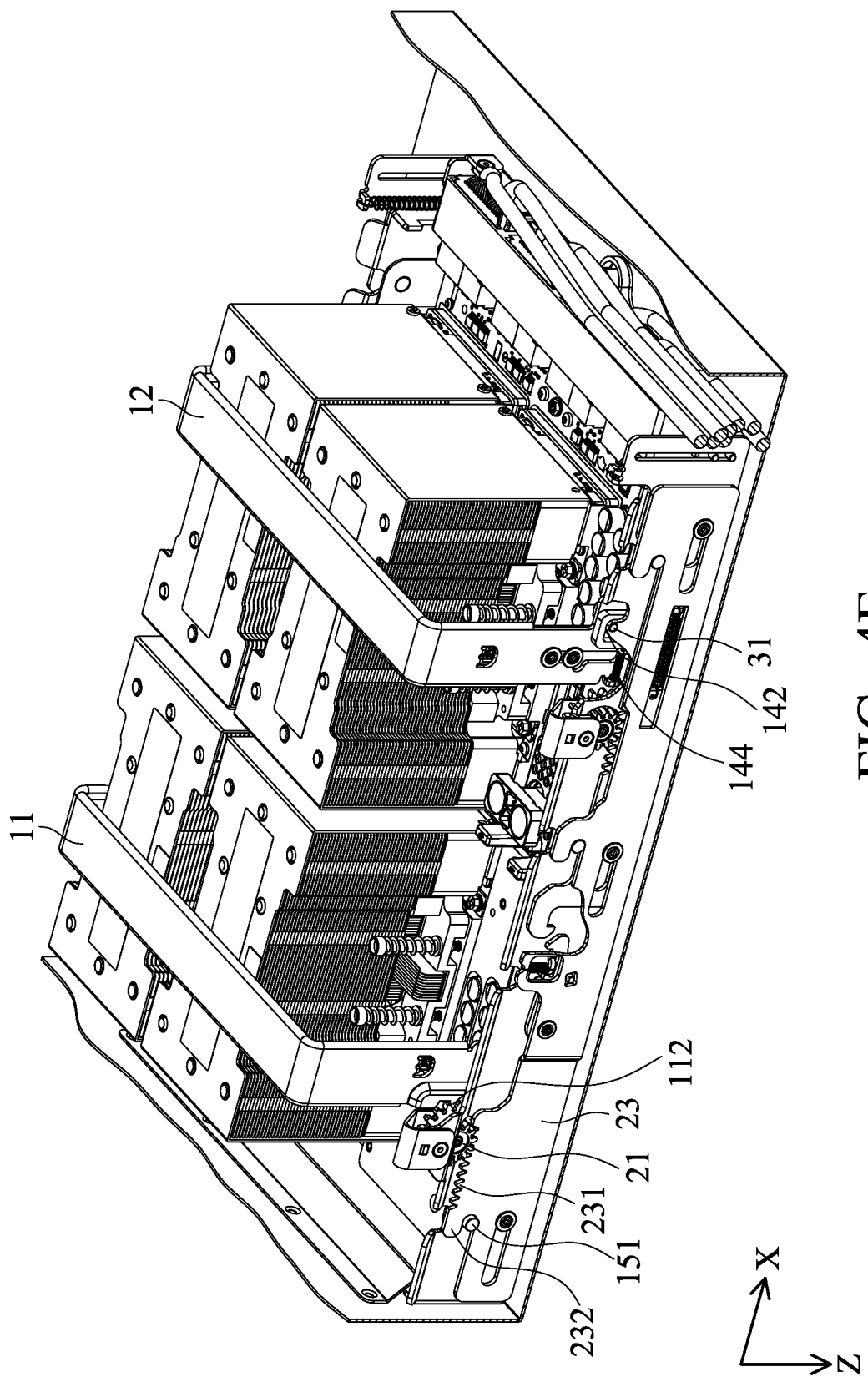

With reference to FIGS. 2, 4C and 4E, in one embodiment, the tray unit 1 comprises a switching post 153. The switching post 153 is adapted to rotate the connecting rod 25, and the rod hook 252 is switched from a connected state (FIG. 4C) to a separated state (FIG. 4E)

With reference to FIGS. 1A and 1B, in one embodiment, the electronic device E further comprises a second elastic member 62. The second elastic member 62 is connected to the housing 3 and the second block 24. The second elastic member 62 is adapted to apply a second elastic force to the housing 3 and the second block 24 to return the second block 24 to the original position.

With reference to FIGS. 1A and 3, in one embodiment, the electronic device further comprises a stage 52. The connector 51 is disposed on the stage 52. The stage 52 is moveably connected to the second block 24. In one embodiment, the second block 24 has a groove 243. The stage 52 has a post 521. The post 521 of the stage 52 is moveably connected to the groove 243 of the second block 24.

With reference to FIGS. 1A and 3, in one embodiment, the electronic device further comprises a third elastic member 63. The third elastic member 63 is connected to the stage 52 and the second block 24. The third elastic member 63 is adapted to apply a third elastic force to the stage 52 and the second block 24 to return the stage 52 to the original position.

With reference to FIG. 1A and FIG. 4A mentioned bellow, in one embodiment, the housing 3 comprises a stopper 32. The stopper 32 is adapted to stop the stage 52 and to prevent a tilt assembling problem.

With reference to FIGS. 2, 3 and 4C, in one embodiment, the tray unit 1 comprises a locking post 151. The first block 23 comprises a block restricting portion 232. The locking post 151 is adapted to be selectively connected to the block restricting portion 232.

With reference to FIGS. 1A and 2, in one embodiment, the first handle 11 pivots on the tray body 13. The second handle 12 pivots on the tray body 13. The user therefore and mount the electronic module 4 and the connection port 41 on the tray body 13 easily.

With reference to FIGS. 1A and 1B, in one embodiment, the electronic module 4 is a graphics processing module. In one embodiment, the electronic module 4 has increased size and weight.

Utilizing the electronic device with plugging and unplugging function of the embodiment of the invention, the tray unit is adapted to move the moving mechanism to connect the connector to the connection port or to separate the connector from the connection port. The user thus can mount the electronic module or remove the electronic module easily. Particularly, when the electronic module has great size and weight, the connector can be connected to the connection port with the weight of the electronic module. When the user lifts up the tray unit, the connector is separated from the connection port automatically. Additionally, utilizing the coaxial gears, the user can reduce the time and effort required for assembly.

The operation of the connector of the embodiment of the invention is mentioned hereafter. FIGS. 4A~4E shows the assembling process of the electronic device of the embodiment of the invention. With reference to FIG. 4A, first, while the user places the tray unit 1 downward, the tray body 13 abuts an upper surface of the stage 52. The post 521 of the stage is in a first position in the groove 243 of the second block. The first gear section 111 of the first handle is separated from the first big gear 211 of the first gear unit 21. Next, with reference to FIG. 4B, the tray unit 1 keeps moving downward, the first gear section 111 moves the first big gear 211 of the first gear unit 21, and the first small gear 212 of the first gear unit 21 moves the first gear portion 231. The first block 23 is connected to the second block 24 via the connecting rod 25, and moves the second block 24 and the stage 52. The connector 51 thus is moved toward the connection port 41. The post 521 of the stage is in a second position in the groove 243 of the second block. Then, with reference to FIG. 4C, the tray unit 1 keeps moving downward. When the first big gear 211 of the first gear unit 21 corresponds to the empty section 113, the connector 51 is sufficiently connected to the connection port 41. The post 521 of the stage is in a third position in the groove 243 of the second block. The housing post 31 enters the switching groove 142. The housing post 31 moves the switching block 14 rightward (X direction), and the switching block gear portion 141 of the switching block 14 is separated from the second big gear 221. The locking post 151 is connected to the block restricting portion 232. Next, with reference to FIG. 4D, the tray unit 1 keeps moving downward. The switching post 153 pushes the connecting rod 25. The rod hook 252 is rotated downward and is separated from the block hook 242. The first block 23 is disconnected from the second block 24. Then, with reference to FIG. 4E, the tray unit 1 keeps moving downward. The second gear section 112 moves the first big gear 211 of the first gear unit 21, and the first small gear 212 of the first gear unit 21 moves the first gear portion 231. The first block 23 is moved to connect the block restricting portion 232 to the locking post 151, and the housing post 31 reaches the top of the switching groove 142. Finally, when the tray unit 1 is moved to the bottom, the housing post 31 reaches the bottom of the right-side switching groove 142, and the switching spring 144 (FIG. 4E) recovers the position of the switching block 14 leftward (−X direction).

Figure 5A:
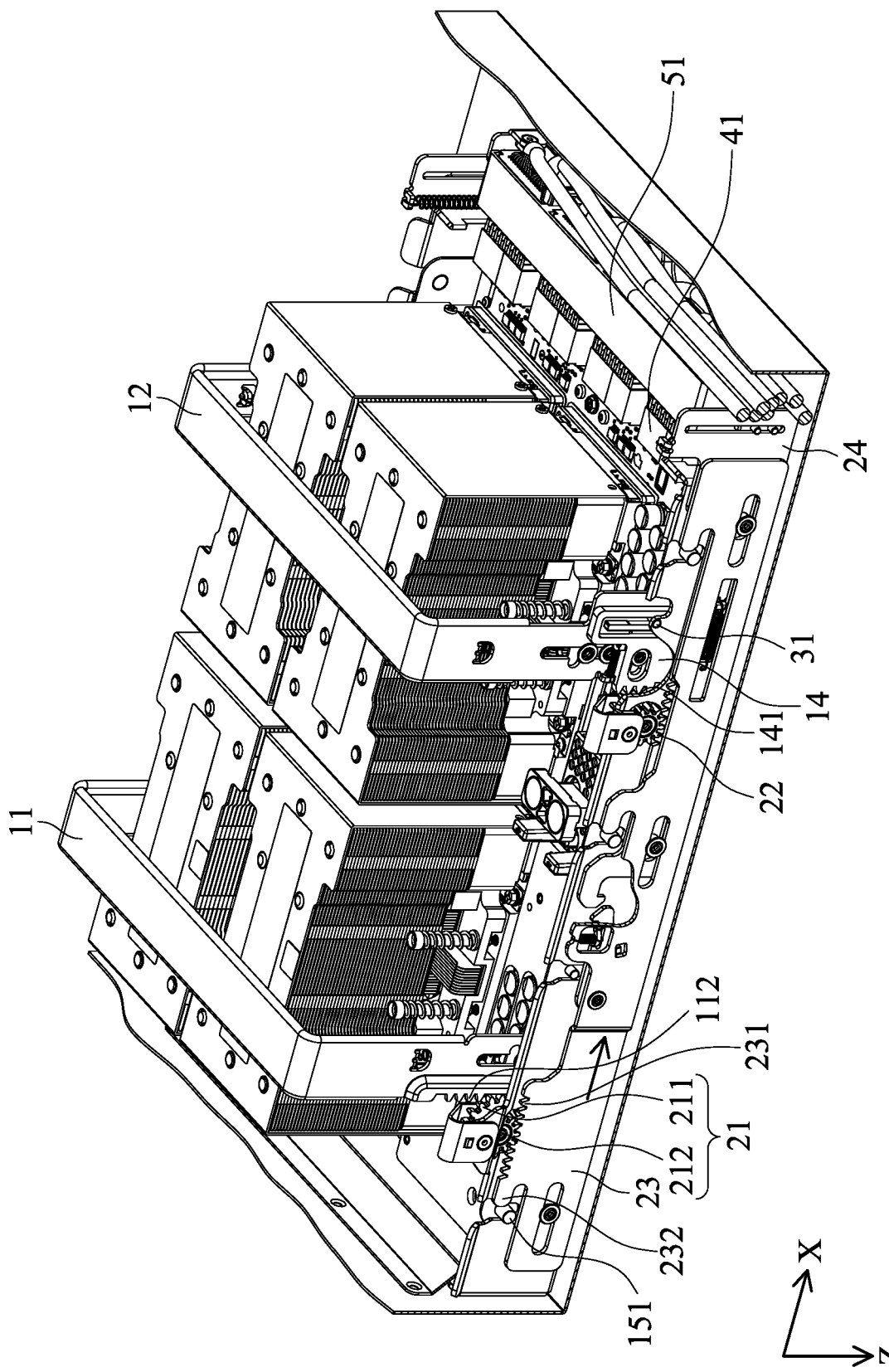
FIGS. 5A~5C shows the detaching process of the electronic device of the embodiment of the invention.
Figure 5B:
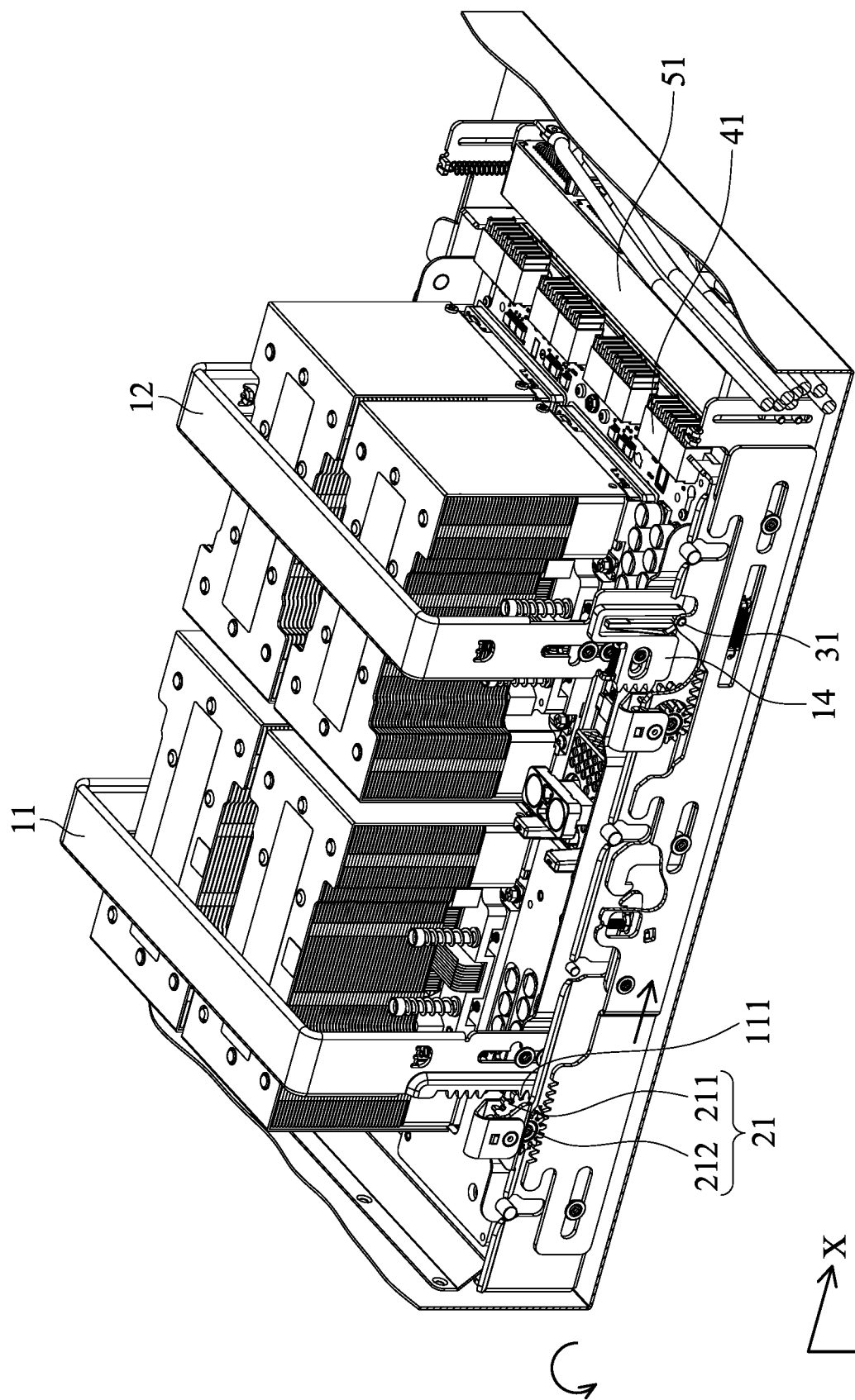
Figure 5C:
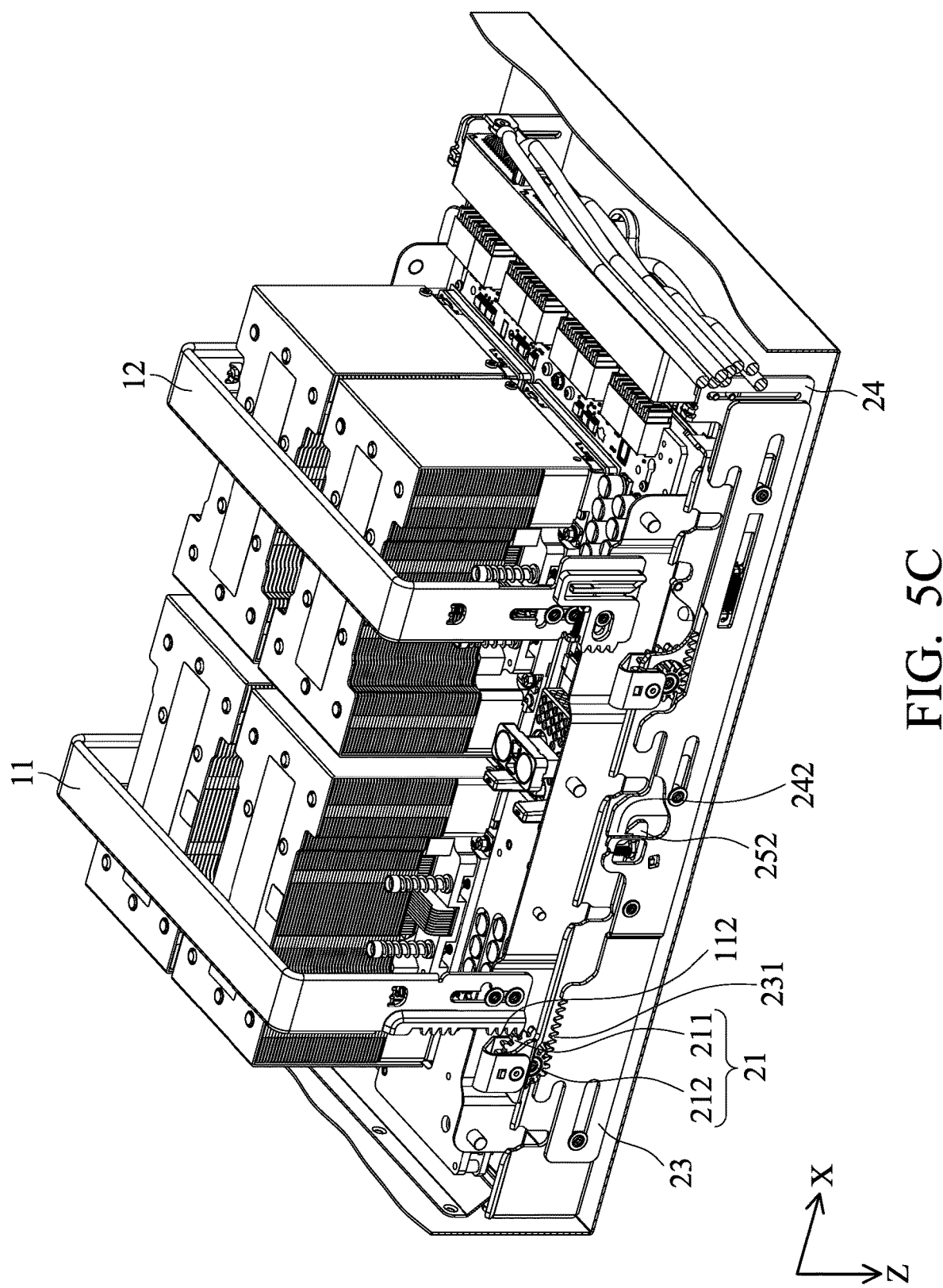

FIGS. 5A~5C shows the detaching process of the electronic device of the embodiment of the invention. First, as shown in FIGS. 4E to 5A, the switching spring 144 pushes the switching block 14 (leftward in the figure), and the switching block gear portion 141 contacts the second gear unit 22. With reference to FIG. 5A, while the first handle 11 is raised, the switching block gear portion 141 contacts the second gear unit 22 and rotates the second gear unit 22 in a counterclockwise direction, and the second block 24 is moved rightward. The second gear section 112 moves the first big gear 211 of the first gear unit 21, the first small gear 212 of the first gear unit 21 moves the first gear portion 231. The first block 23 is moved (rightward) to separate the block restricting portion 232 from the locking post 151. At the same time, while the second handle 12 is raised. The second gear unit 22 moves the second block 24 and the stage 52.

The connector 51 starts to be separated from the connection port 41. The switching post 153 rotates the rod hook 252 (the rod hook 252 is still separated from the lock hook 242). Next, with reference to FIG. 5B, the tray unit 1 keeps moving upward. The housing post 31 is finally separated from the right-side switching block 14 at a lower position. The connector 51 is sufficiently separated from the connection port 41. The first gear unit 21 is connected to the first gear section 111. The switching block gear portion 141 of the switching block 14 on the second handle 12 is separated from the second gear unit 22, and the second block 24 is stopped. The rod hook 252 contacts the block hook 242. Then, with reference to FIG. 5C, the tray unit 1 keeps moving upward. The first gear section 111 moves the first gear unit 21. The first gear unit 21 moves the first gear portion 231. The first block 23 is moved rightward relative to the second block 24 (as shown in FIG. 5B to FIG. 5C). Finally, the rod hook 252 is reconnected to the block 242, and return to the original (connected) state.

In the process as shown in FIGS. 4C~5B, the housing post 31 is moved in the U-shaped switching groove 142. Particularly, when the second handle 12 is raised, the housing post 31 is moved downward in the switching groove 142. The housing post 31 pushes the switching block 14, and the switching block gear portion 141 moves the second gear unit 22.

In the assembling process shown in FIGS. 4A~4C, the connecting rod 25 is utilized to connect the first block 23 to the second block 24, and the second block 24 is thus moved with the first block 23. In FIG. 4D, the switching post 153 pushes the connecting rod 25 to separate the rod hook 252 from the block hook 242. The first block 23 is therefore disconnected from the second block 24. In the detaching process as shown in FIGS. 5A~5B, the first block 23 is separated from the second block 24. In FIG. 5C, the rod hook 252 is reconnected to the block hook 242 by the first elastic member 61. The second block 24 is moved to the original position relative to the housing 3 by the second elastic member 62. The stage 52 is moved to the original position relative to the second block 24 by the third elastic member 63.

In FIGS. 4A~4E and 5A~5C, for the sake of clarity, part of the content is shown partially broken. The disclosure is not meant to restrict the invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with plugging and unplugging function, having a connector, wherein the connector is selectively connected to a connection port of an electronic module, comprising:
   a tray unit, comprising a first handle and a second handle;
   a housing, wherein the tray unit is moveably disposed in the housing; and
   a moving mechanism, disposed on the housing, wherein the moving mechanism is adapted to be moved with the first handle and the second handle, and the connector is connected to or disconnected from the connection port via being moved by the moving mechanism.

2. The electronic device as claimed in claim 1, wherein the tray unit comprises a tray body and a switching block, the first handle is connected to the tray body, the second handle is connected to the tray body, the switching block is disposed at the second handle and is moveably connected to the tray body, and the tray unit is moved relatively to the housing in a first direction.

3. The electronic device as claimed in claim 2, wherein the moving mechanism comprises a first gear unit, a second gear unit, a first block, a second block and a connecting rod, the first gear unit is connected to the first block, the second gear is connected to the second block, the connecting rod is connected to the first block and a second block, the second block is moved relatively to the first block in a second direction, and the second direction is perpendicular to the first direction.

4. The electronic device as claimed in claim 3, wherein the first handle comprises a first gear section, a second gear section and an empty section, the empty section is located between the first gear section and the second gear section, the first gear unit is connected to the first gear section or the second gear section.

5. The electronic device as claimed in claim 4, wherein the first block comprises a first gear portion, the first gear unit is connected to the first gear portion, and an extending direction of the first gear portion is perpendicular to an extending direction of the first gear section and the second gear section.

6. The electronic device as claimed in claim 5, wherein the first gear unit comprises a first big gear and a first small gear, the first big gear is coaxial with the first small gear, the first big gear is connected to the first gear section or the second gear section, and the first small gear is connected to the first gear portion.

7. The electronic device as claimed in claim 3, wherein the switching block comprises a switching block gear portion, the second block comprises a second gear portion, the second gear unit is connected to the second gear portion, and an extending direction of the second gear portion is perpendicular to an extending direction of the switching block gear portion.

8. The electronic device as claimed in claim 7, wherein the second gear unit comprises a second big gear and a second small gear, the second big gear is coaxial with the second small gear, the second big gear is selectively connected to the switching block gear portion, and the second small gear is connected to the second gear portion.

9. The electronic device as claimed in claim 8, wherein the housing comprises a housing post, the switching block comprises a switching groove, the housing post is slid in the switching groove, and the switching block is moved by the housing post.

10. The electronic device as claimed in claim 9, wherein the switching groove is U-shaped.

11. The electronic device as claimed in claim 3, wherein the connecting rod comprises a rod hook, the second block comprises a block hook, the rod hook is selectively connected to the block hook, and the connecting rod pivots on the first block.

12. The electronic device as claimed in claim 11, further comprising a first elastic member, the first elastic member is connected to the first block and the connecting rod, when the connecting rod is rotated, the first elastic member applies a first elastic force to the connecting rod.

13. The electronic device as claimed in claim 12, wherein the tray unit comprises a switching post, the connecting rod is moved by the switching post.

14. The electronic device as claimed in claim 12, further comprising a second elastic member, wherein the second elastic member is connected to the housing and the second block, when the second block is moved, the second elastic member applies a second elastic force to the housing and the second block.

15. The electronic device as claimed in claim 3, further comprising a stage, the connector is disposed on the stage, and the stage is moveably connected to the second block.

16. The electronic device as claimed in claim 15, further comprising a third elastic member, wherein the third elastic member is connected to the stage and the second block, when the stage is moved, the third elastic member applies a third elastic force to the stage and the second block.

17. The electronic device as claimed in claim 15, wherein the housing comprises a stopper, and the stage is stopped via the stopper.

18. The electronic device as claimed in claim 12, wherein the tray unit comprises a locking post, the first block comprises a block restricting portion, and the locking post is selectively connected to the block restricting portion.

19. The electronic device as claimed in claim 3, wherein the first handle pivots on the tray body, and the second handle pivots on the tray body.

20. The electronic device as claimed in claim 1, wherein the electronic module is a graphics processing module.

* * * * *